United States Patent [19]
Huang

[11] Patent Number: 6,013,923
[45] Date of Patent: Jan. 11, 2000

[54] SEMICONDUCTOR SWITCH ARRAY WITH ELECTROSTATIC DISCHARGE PROTECTION AND METHOD OF FABRICATING

[75] Inventor: Zhong Shou Huang, Mississauga, Canada

[73] Assignee: 1294339 Ontario, Inc., Toronto, Canada

[21] Appl. No.: 09/000,479

[22] PCT Filed: Jul. 31, 1995

[86] PCT No.: PCT/CA95/00454

§ 371 Date: Jul. 21, 1998

§ 102(e) Date: Jul. 21, 1998

[87] PCT Pub. No.: WO97/05654

PCT Pub. Date: Feb. 13, 1997

[51] Int. Cl.[7] .................................................. H01L 23/62
[52] U.S. Cl. ............................................ 257/59; 257/356
[58] Field of Search .................................. 349/139, 143; 257/59, 355–363

[56] References Cited

U.S. PATENT DOCUMENTS

| | | |
|---|---|---|
| 4,803,536 | 2/1989 | Tuan . |
| 5,220,443 | 6/1993 | Noguchi . |
| 5,313,319 | 5/1994 | Salisbury . |
| 5,371,351 | 12/1994 | Van Berkel . |
| 5,373,377 | 12/1994 | Ogawa et al. ............ 257/356 |
| 5,497,146 | 3/1996 | Hebiguchi ................ 257/59 |
| 5,504,348 | 4/1996 | Yoshida et al. ........... 257/59 |
| 5,668,032 | 9/1997 | Holmberg et al. ........ 257/59 |
| 5,909,035 | 6/1999 | Kim ......................... 257/59 |

FOREIGN PATENT DOCUMENTS

| | | |
|---|---|---|
| 0 616 241 A2 | 3/1994 | European Pat. Off. . |
| 62198826 | 2/1986 | Japan . |
| 1303416 | 5/1988 | Japan . |
| 2061618 | 8/1988 | Japan . |
| 224 2229 | 9/1990 | Japan . |
| 300 2838 | 9/1991 | Japan . |
| WO 97/05654 | 9/1991 | WIPO . |

OTHER PUBLICATIONS

Sang U. Kim, "ESD induced gate oxide damage during wafer fabrication process," *Journal of Electrostatics*, (Dec., 1993).

*Primary Examiner*—David B. Hardy
*Attorney, Agent, or Firm*—Fay, Sharpe, Fagan, Minnich & McKee, LLP

[57] ABSTRACT

A method of inhibiting electrostatic discharge damage to an array of semiconductor switches (21) formed on a common substrate and arranged in rows and columns comprises the steps of: during formation of gate lines (24) that interconnect one of the rows and columns of the array, connecting one end of each gate line directly to a shorting ring (52) and another end of each gate line to a shorting ring (56) via a protection element (54); during formation of the source lines (26) that interconnect the other of the rows or columns of the array, connecting one end of each source line directly to a shorting ring (56) and connecting another end of each source line to a shorting ring (56) via a protection element (58); and electrically coupling the shorting rings (52, 56). A semiconductor switch array (21) incorporating electrostatic discharge protection (50) is also provided.

20 Claims, 7 Drawing Sheets

SEMICONDUCTOR SWITCH ARRAY WITH ELECTROSTATIC DISCHARGE PROTECTION AND METHOD OF FABRICATING

TECHNICAL FIELD

The present invention relates to a method of protecting a semiconductor switch array from electrostatic discharge damage and to a semiconductor switch array incorporating electrostatic discharge protection.

BACKGROUND ART

Electrostatic discharge (ESD) damage is a well known phenomenon and can occur during the fabrication of semiconductor devices such as metal-oxide semiconductor (MOS) structures. In structures of this nature, ESD damage can result in gate insulating layer breakdown, large shifts in threshold voltage and large leakage currents between the gate and source electrodes or gate and drain electrodes.

ESD damage is a more pronounced problem during the fabrication of thin film transistor (TFT) switch arrays for use in liquid crystal displays or in flat panel detectors for radiation imaging. This is due to the fact that the TFT switches are formed on an insulating substrate (typically glass) and thus, the source and drain electrodes may charge to a very high voltage. Also, because peripheral circuits to which the TFT switch array is to be connected are generally not formed on the same substrate as the TFT switch array, the gate and source lines must extend from the TFT switch array sufficiently to allow the peripheral circuits to be connected to the TFT switch array via wire bonding pads. Any static charge picked up by the gate and source lines is transferred to the gate and source electrodes of the TFT switches as well as to the intersecting nodes of the gate and source lines where the static charge is held. If the static charge reaches a high enough level, the dielectric gate insulating layer between the gate and source electrodes may breakdown. Even if this breakdown can be avoided, the voltage differential between the gate and source electrodes or gate and drain electrodes caused by this held static charge may cause the threshold voltage of the TFT switches to shift in either a positive or negative direction.

Recently, a large amount of attention has been given to the problems resulting from ESD damage especially in active matrix liquid crystal displays and flat panel detectors for radiation imaging. It is now believed that ESD damage is also caused by equipment related problems during the fabrication, handling and testing of these types of devices. The trends to use higher throughput equipment with higher speed substrate handling as well as to downscale during the fabrication process to reduce metal line width and reduce parasitic capacitance in the TFT switches decrease ESD immunity.

One common ESD damage protection circuit used with TFT switch arrays makes use of closed shorting bars surrounding the TFT switch array to link all of the source lines and the gate lines of the TFT switch array together. The shorting bar associated with the gate lines is formed at the time the gate lines are formed while the shorting bar associated with the source lines is formed at the time the source lines are formed. The two shorting bars are electrically connected through vias formed in the TFT switch array structure. Because the shorting bars connect the gate and source electrodes of all of the TFT switches in the array, the gate and source electrodes remain at the same potential throughout the fabrication process. This prevents any voltage differentials from occurring across the gate and source electrodes and therefore, inhibits ESD damage at these electrodes.

Once the TFT switch array has been completely fabricated, the shorting bars are removed by cutting off part of the glass substrate where the shorting bars located. This cutting process is done before the individual TFT switches are tested and before the gate and source lines are connected to peripheral circuits.

Although the above ESD damage protection circuit is widely used, once the shorting bars have been removed, to ESD damage protection remains. This poses problems since ESD damage often occurs during testing of the TFT switches and during bonding of the gate and source lines to peripheral equipment. This is in view of the fact that at this stage, the TFT switch array is handled by individuals and contacted with electronic measuring equipment.

Another ESD damage protection network for TFT switch arrays is disclosed in U.S. Pat. No. 4,803,536. This ESD damage protection network makes use of a strip of $N^+$ amorphous silicon resistive material film extending to all of the bonding pads. The value of the resistive material film is at least an order of magnitude greater than the impedance of external driver circuits connected to the bonding pads. By manipulating the resistance of the resistive material film, static charges disperse to all of the gate and source lines with an RC constant. Although individual TFT switches can be tested without removing the resistive material film, the resistive material film crosses over all of the gate and source lines. This causes crosstalk and electronic noise which in certain applications, such as x-ray imaging where signal currents are small, are serious problems.

U.S. Pat. No. 5,313,319 discloses yet another ESD protection circuit for a TFT switch array. This protection circuit includes static protection capacitors formed on the substrate of the TFT switch array between the gate and source lines. The thickness of the static protection capacitors are chosen to ensure that they breakdown due to static charges before ESD damage to the TFT switches occurs. Unfortunately, the static protection capacitors increase stray capacitance in the TFT switch array thereby increasing electronic noise making the TFT switch array unsuitable for many applications.

Japanese Patent Nos. JPA2-61618, JPA62-198826 and JPA1-303416 and U.S. Pat. No. 5,371,351 disclose an ESD protection circuit for a TFT switch array which makes use of photodiodes formed of an a-Si film. The photodiodes connect the gate lines with the source lines to minimize any potential voltage difference between them. When the photodiodes are illuminated, the resistance of the protection circuit decreases dramatically creating short circuits between the gate and source lines. When testing individual TFT switches, or when operating the TFT switch array in normal conditions, no incident light is permitted to impinge on the photodiodes. This keeps the resistance of the protection circuit very high to minimize crosstalk and leakage currents.

U.S. Pat. No. 5,220,443 discloses an ESD protection circuit for a TFT switch array. The protection circuit includes a common electrode interconnecting the gate and source lines. Non-linear resistive elements having a resistance that decreases with an increase in voltage are connected between the gate and source lines. The non-linear resistive elements are realized using two back to back thin film diodes. Because the resistive elements provide a large resistance between the gate and source lines, individual TFT switches can be tested without cutting the glass substrate.

Even after cutting the glass substrate, some of the non-linear resistive elements remain to improve the immunity of the TFT switch array to ESD damage. However, the immunity of the TFT switch array to ESD damage after cutting is significantly less than before cutting.

The prior art ESD protection circuits referred to above all have some common drawbacks. Firstly, none of the ESD protection circuits protect the TFT switch array from the first manufacturing stage (usually gate line formation) to the last manufacturing stage (usually wire bonding). During the manufacture of TFT switch arrays for liquid crystal displays, it has been found that ESD damage may occur during the process of spin coating or stripping photoresist, during the cleaning process using DI water, and during plasma etching. These processes are often performed prior to the completion of the TFT switch array structure. Isolating the gate lines before finishing source line metallization as suggested in the prior art may result in the build up of electrostatic charge on the gate lines. Electrostatic charges on the gate lines may become buried under the dielectric film forming the gate insulating layer and incubate until later stages in the manufacturing process. During these later stages, the buried electrostatic charges may move along the gate lines and concentrate at a few points or boundary lines causing a breakdown in the dielectric gate insulating layer.

In addition, in some instances since the gate and source lines are interconnected by protection elements, a failure in the connection between a gate or source line and a protection element will result in the gate or source line being isolated from the common electrode.

In the case of U.S. Pat. No. 5,220,443, although some ESD damage protection circuitry remains on the substrate during the wire bonding process, the impedance between an arbitrary gate line and a source line may become too large to discharge electrostatic charge quickly enough to avoid ESD damage. Accordingly, better protection against ESD damage is desired.

It is therefore an object of the present invention to provide a reliable method of protecting a semiconductor switch array from ESD damage and a semiconductor switch array incorporating electrostatic discharge protection which obviates or mitigates at least one of the above-described disadvantages.

SUMMARY OF THE INVENTION

According to one aspect of the present invention there is provided a method of inhibiting electrostatic discharge damage to an array of semiconductor switches formed on a common substrate and arranged in rows and columns, individual ones of one of the rows or columns of said array being interconnected by source lines and the individual ones of the other of the rows or columns of said array being interconnected by gate lines, said method comprising the steps of:

during formation of said gate lines, connecting one end of each gate line directly to a shorting element and another end of each gate line to a shorting element via a protection element;

during formation of said source lines, connecting one end of each source line directly to a shorting element and connecting another end of each source line to a shorting element via a protection element; and electrically coupling said shorting elements.

According to yet another aspect of the present invention there is provided a semiconductor switch array incorporating electrostatic discharge protection comprising:

an array of semiconductor switches formed on a common substrate and arranged in rows and columns, the individual ones of one of the rows or columns of said array being interconnected by source lines and the individual ones of the other of said rows or columns being interconnected by gate lines; and a pair of electrically coupled shorting elements formed on said substrate, each of said gate and source lines being connected to one of said shorting elements directly and to one of said shorting elements via a protection element.

In one embodiment, it is preferred that the method further comprises the step of connecting the one and another ends of each of the source lines to a first shorting element, connecting the one ends of each of the gate lines to a second shorting element and the another ends of each of the gate lines to the first shorting element electrically coupling the first and second shorting elements.

In another embodiment, it is preferred that the method further comprises the step of connecting the one ends of the source and gate lines to a first shorting element, connecting the another ends of the source and gate lines to a second shorting element and electrically coupling the first and second shorting elements. In this case, it is also preferred that the one and another ends of the source and gate lines alternate between opposite sides of the array. In both embodiments, it is preferred that the protection elements are in the form of resistive protection elements.

The present invention provides advantages in that the ESD damage protection is maintained throughout the entire manufacturing and testing process of the semiconductor switch array and is fully compatible with conventional semiconductor switch array fabrication processes.

BRIEF DESCRIPTION OF THE DRAWINGS

Embodiments of the present invention will now be described more fully with reference to the accompanying drawings in which.

BEST MODES FOR CARRYING OUT THE INVENTION

Figure 1:
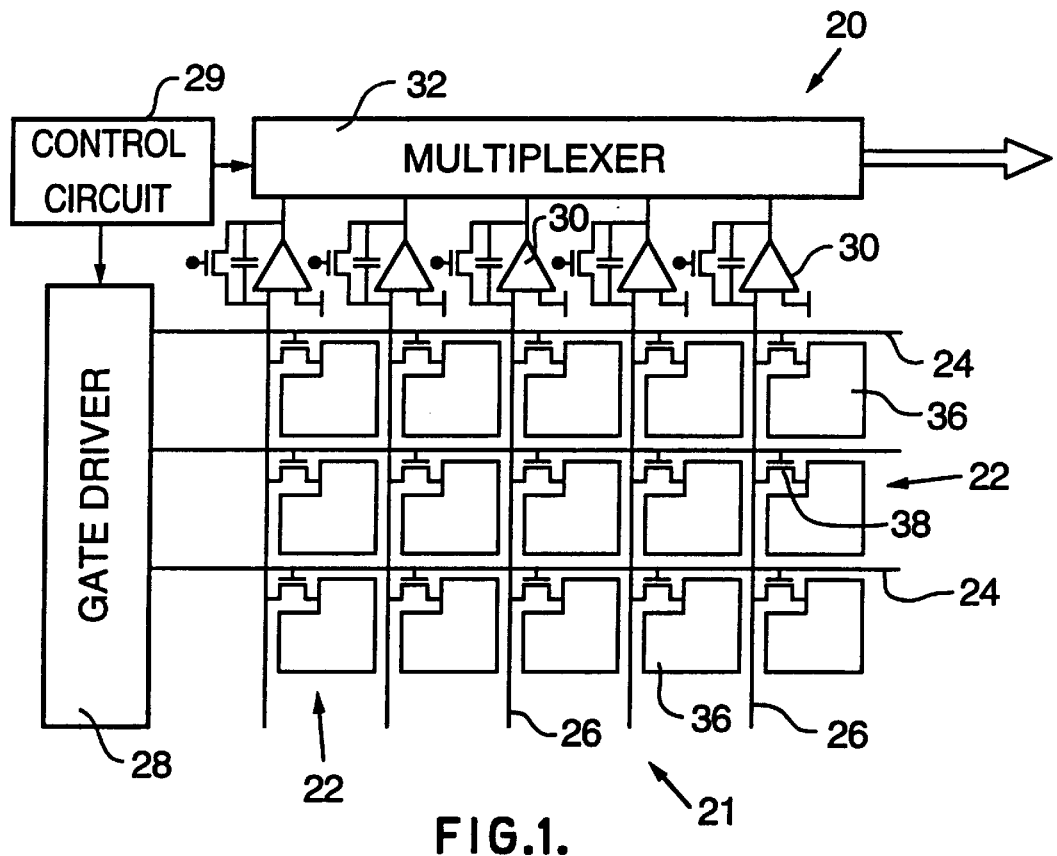
FIG. 1 is a schematic of a flat panel detector for radiation imaging incorporating a TFT switch array.

Referring now to FIG. 1, a flat panel detector for radiation imaging is shown and is generally indicated by reference numeral 20. The flat panel detector includes a semiconductor switch array 21 in the form of a plurality of pixels 22 arranged in rows and columns. Gate lines 24 interconnect the pixels 22 of each row while source lines 26 interconnect the pixels of each column. The gate lines 24 lead to a gate driver circuit 28 which provides pulses to the gate lines in succession in response to input from a control circuit 29. The source lines 26 lead to charge amplifiers 30 which in turn are connected to an analog multiplexer 32. The analog multiplexer provides image output which can be digitized to create a digitized radiation image in response to input from the control circuit 29.

Figure 2:
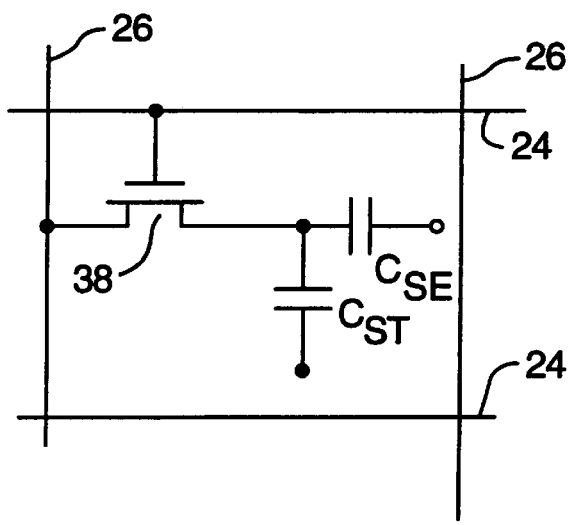
FIG. 2 is an equivalent circuit of a pixel forming part of the flat panel detector illustrated in FIG. 1.

FIG. 2 shows an equivalent circuit of one of the pixels 22. As can be seen, the pixel 22 includes a radiation transducer CS. coupled to a storage capacitor $C_{ST}$ in the form of a pixel electrode 36. The pixel electrode 36 constitutes the drain electrode of a thin film transistor ("TFT") switch 38. The source electrode of TFT switch 38 is coupled to one of the source lines 26 while the gate electrode of the TFT switch is coupled to one of the gate lines 24.

When the radiation transducer $C_{SE}$ is biased and is exposed to radiation, it causes the pixel electrode to store a charge proportional to the exposure of the radiation transducer $C_{SE}$, to radiation. Once charged, the charge can be read by supplying a gating pulse to the gate terminal of TFT switch 38. When the TFT switch receives the gate pulse, it connects the pixel electrode 36 to the source line 26 allowing the pixel electrode to discharge. The charge on the source line 26 is detected by the charge amplifier 30 which in turn generates an output voltage proportional to the detected charge. The output voltage of the charge amplifier is conveyed to the analog multiplexer 32.

Figure 3:
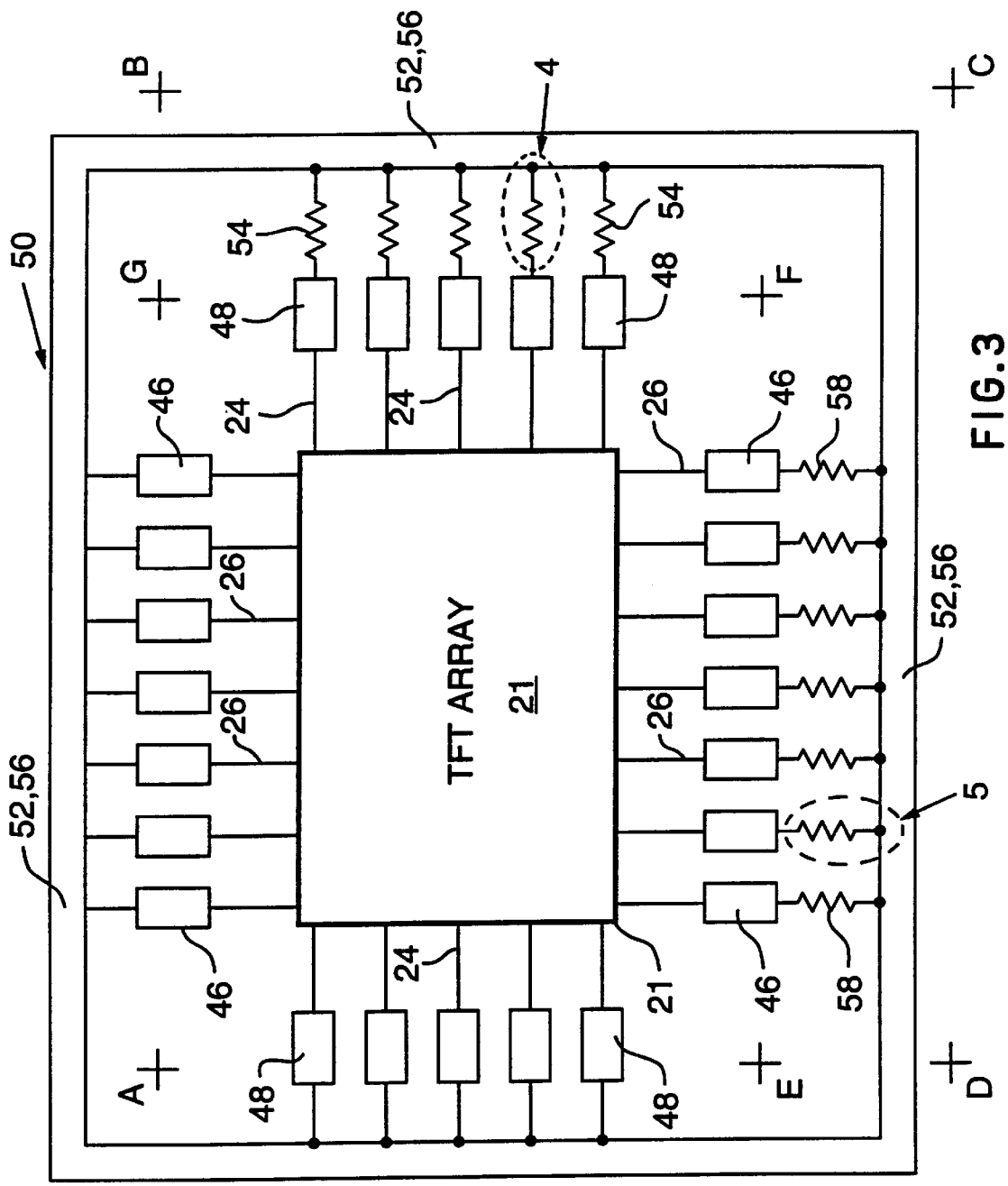
FIG. 3 is a schematic of a TFT switch array incorporating an ESD damage protection circuit.

Referring now to FIG. 3, during the fabrication process, the array 21 of pixels 22 including the gate and source lines 24 and 26 respectively are fabricated on a common glass substrate. Wire bonding pads 46 are formed at the ends of the source lines 26 for testing or for wire bonding purposes. Similarly, wire bonding pads 48 are formed at the ends of the gate lines 24. As mentioned previously, during fabrication of the TFT switch array 21, during its testing or when connecting peripheral circuits to the TFT switch array 21 such as gate driver 28 and charge amplifiers 30, ESD damage to the TFT switch array may occur. To reduce the occurence of ESD damage during fabrication of the TFT switch array 21, an ESD damage protection circuit 50 is also fabricated on the glass substrate as will now be described.

The ESD damage protection circuit 50 includes a first shorting element in the form of a ring 52 surrounding the TFT switch array and interconnecting all of the gate lines 24 of the TFT switch array 21. Specifically, the shorting ring 52 is connected directly to the wire bonding pads 48 on one side of the TFT switch array 21.

A second shorting element in the form of a ring 56 also surrounds the TFT switch array and interconnects all of the source lines 26 of the TFT switch array 21. The second shorting ring 56 is connected directly to the wire bonding pads 46 on one side of the TFT switch array 21 and is connected to the wire bonding pads 46 on the other side of the TFT switch array through resistive protection elements 58. Shorting ring 56 is also connected to each of the wire bonding pads 48 on the other side of the TFT switch array 21 through a resistive protection element 54. The two shorting rings 52 and 56 are electrically connected through vias (not shown) formed in the TFT switch array structure. The resistive protection elements 54, 58 provide current paths for leaking electrostatic charges collected by the gate and source lines 24 and 26 and have resistances at least one order of magnitude greater than the impedance of the gate and source lines.

Figure 4:
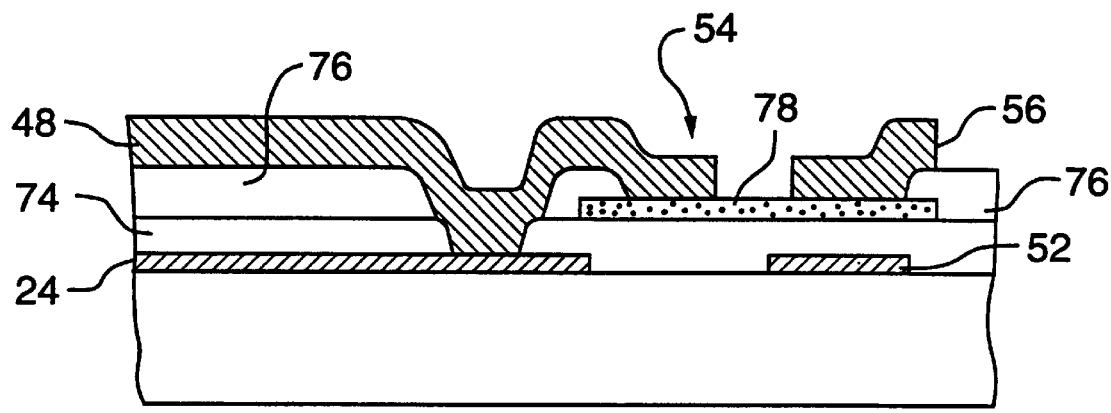
FIG. 4 is a cross-sectional view of FIG. 3.
Figure 5:
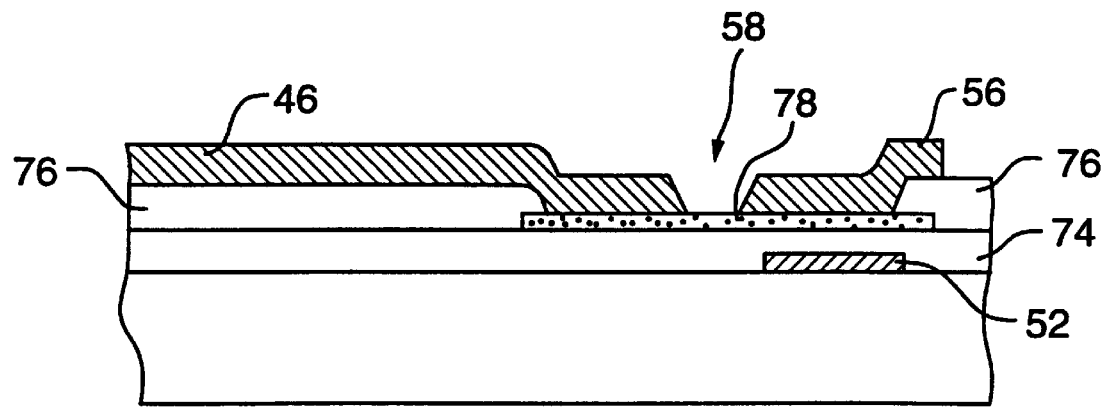
FIG. 5 is another cross-sectional view of FIG. 3.
Figure 6:
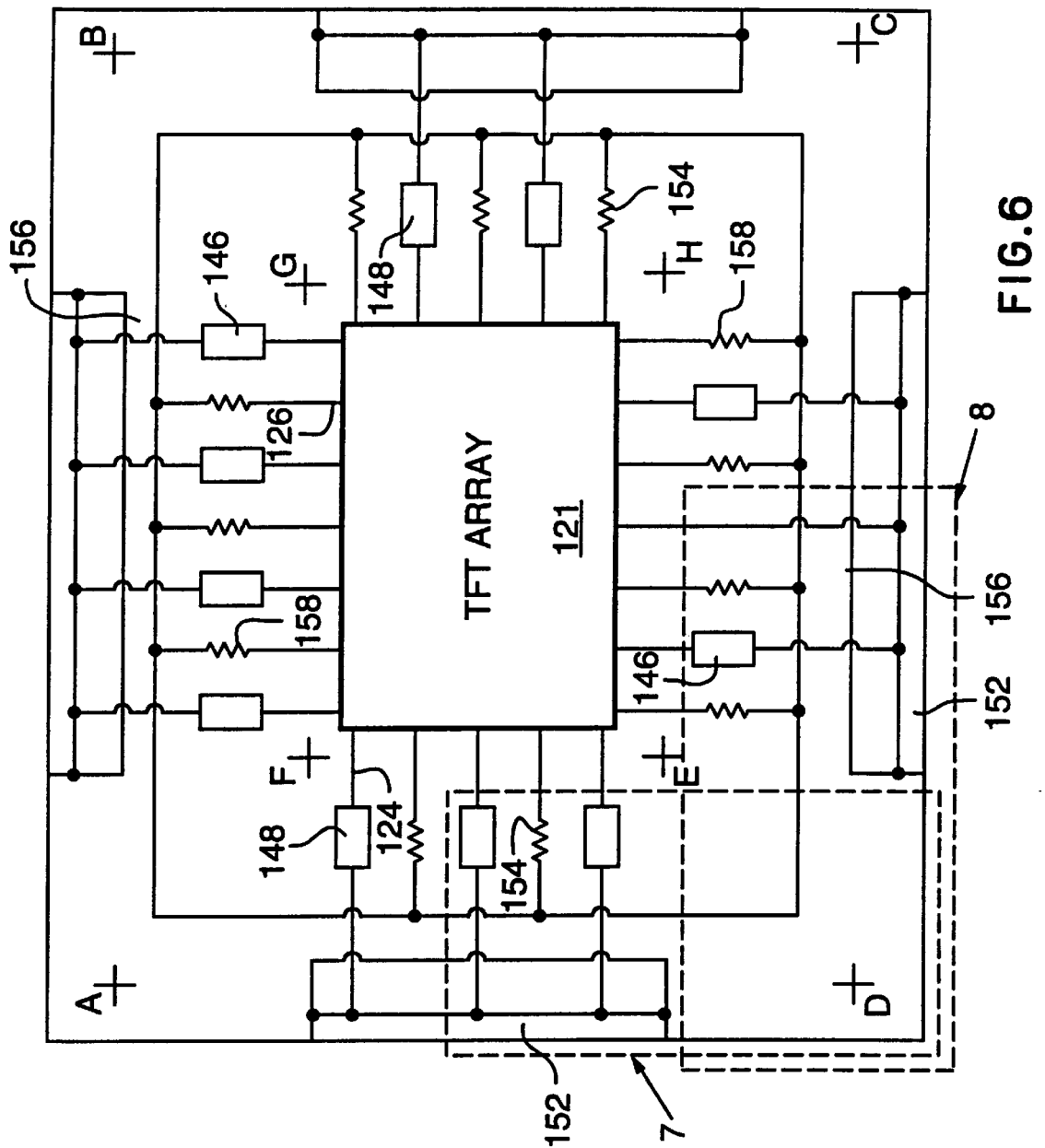
FIG. 6 is a schematic of an alternative embodiment of a TFT switch array incorporating an ESD damage protection circuit.

FIGS. 4 and 5 best illustrate the resistive protection elements 54 and 58 respectively. As can be seen in FIG. 4, resistive protection element 54 includes a Cadmium Selenide (CdSe) semiconductor material channel 78. Wire bonding pad 48 contacts the channel 78 through a via formed in the gate insulating layer 74 and passivation layer 76. Shorting ring 56 also contacts the channel 78. Resistive protection element 58 also includes a CdSe channel 78 contacted by wire bonding pad 46 and shorting ring 56. Shorting ring 56 as mentioned previously is connected to shorting ring 52 through vias (not shown). The resistances of the resistive protection elements 54 and 58 can be designed to change with bias voltage in a linear or non-linear manner and may take the form of one of a variety of structures such as for example, TFT switches, TFD's (thin film diodes), zener diodes or photodiodes.

As one of skill in the art will appreciate, the shorting ring 52 is formed when the gate lines 24 are being formed on the substrate of the TFT switch array structure. The shorting ring 56 is formed when the source lines 26 are being formed on the substrate.

After the TFT switch array 21 and ESD damage protection circuit 50 have been formed on the glass substrate, the TFT switch array structure can be cut along scribe lines ABCDA to expose the wire bonding pads 46 and 48 connected to the source and gate lines extending from one side of the TFT switch array permitting the individual TFT switches 38 in the array to be tested. These scribe lines are marked so that part of each shorting ring 52, 56 remains intact keeping the gate and source lines 24 and 26 interconnected through the resistive protection elements 54 and 58 during the testing stage. If electrostatic charges appear on the gate or source lines resulting in any unbalanced potentials across the dielectric film constituting the gate insulating layer of the TFT switch array, the electrostatic charges will disperse quickly through the resistive protection elements connected to the gate and source lines.

Once testing has been completed, the outputs from the gate driver 28 can be connected to the wire bonding pads 48 of the exposed gate lines 24 via a wire bonding process. Similarly, the inputs to the charge amplifiers 30 can be connected to the wire bonding pads 46 of the exposed source lines 26 via a wire bonding process. Thus, the TFT switch array 21 can be connected to the peripheral circuitry with half of the ESD damage protection circuit intact.

After the wire bonding processes have been completed, the remaining half of the ESD damage protection circuit 50 can be severed from the TFT switch array 21 using a laser cutting operation made along scribe lines EFG. However, the remaining half of the ESD damage protection circuit may be useful when the flat panel detector 20 is in operation by allowing gate pulses applied to the gate lines to be fed back to the gate driver 28 to shape the gate pulse waveform or to reduce electronic noise. In addition, the remaining connections between the resistive protection elements 54 and 58 and the shorting rings 52 and 56 permits excess charge to leak to ground, in the event that bond-wires peel off or in the event that defects in the charge amplifiers 30 or gate drivers 28 occur.

In some applications especially in high resolution TFT liquid crystal displays and TFT flat panel detectors, it is desired to use peripheral circuitry connected to the gate and source lines on both sides of the TFT switch array 21. Referring now to FIGS. 6 to 9, another embodiment of a TFT switch array 121 incorporating an ESD damage protection circuit 150 is shown which is better suited to accommodate double-sided peripheral circuitry. In this embodiment, like reference numerals will be used to indicate like components with a ("100") added for clarity.

As can be seen, the ESD damage protection circuit 150 includes a shorting ring 152 interconnecting all of the gate lines 124 of the TFT switch array 121. The shorting ring 152 is connected to only one end of each gate line 124 through wire bonding pads 148. The connections between the shorting ring 152 and the wire bonding pads 148 alternate between opposite sides of the TFT switch array. Shorting ring 152 also interconnects all of the source lines 126 of the TFT switch array through vias formed in the TFT switch array structure. The shorting ring 152 is connected to only one end of each source line 126 through wire bonding pads 146. The connections between the shorting ring 152 and the wire bonding pads 146 also alternate between opposite sides of the TFT switch array 121.

A second shorting ring 156 is connected to the other end of each gate line 124 via resistive protection elements 154. Shorting ring 156 is also connected to the other end of each source line 126 via resistive protection elements 158. The shorting rings 152 and 156 are electrically connected through vias 160 and 162 formed at the corners of the TFT switch array structure (see FIGS. 7 and 8).

Figure 7:
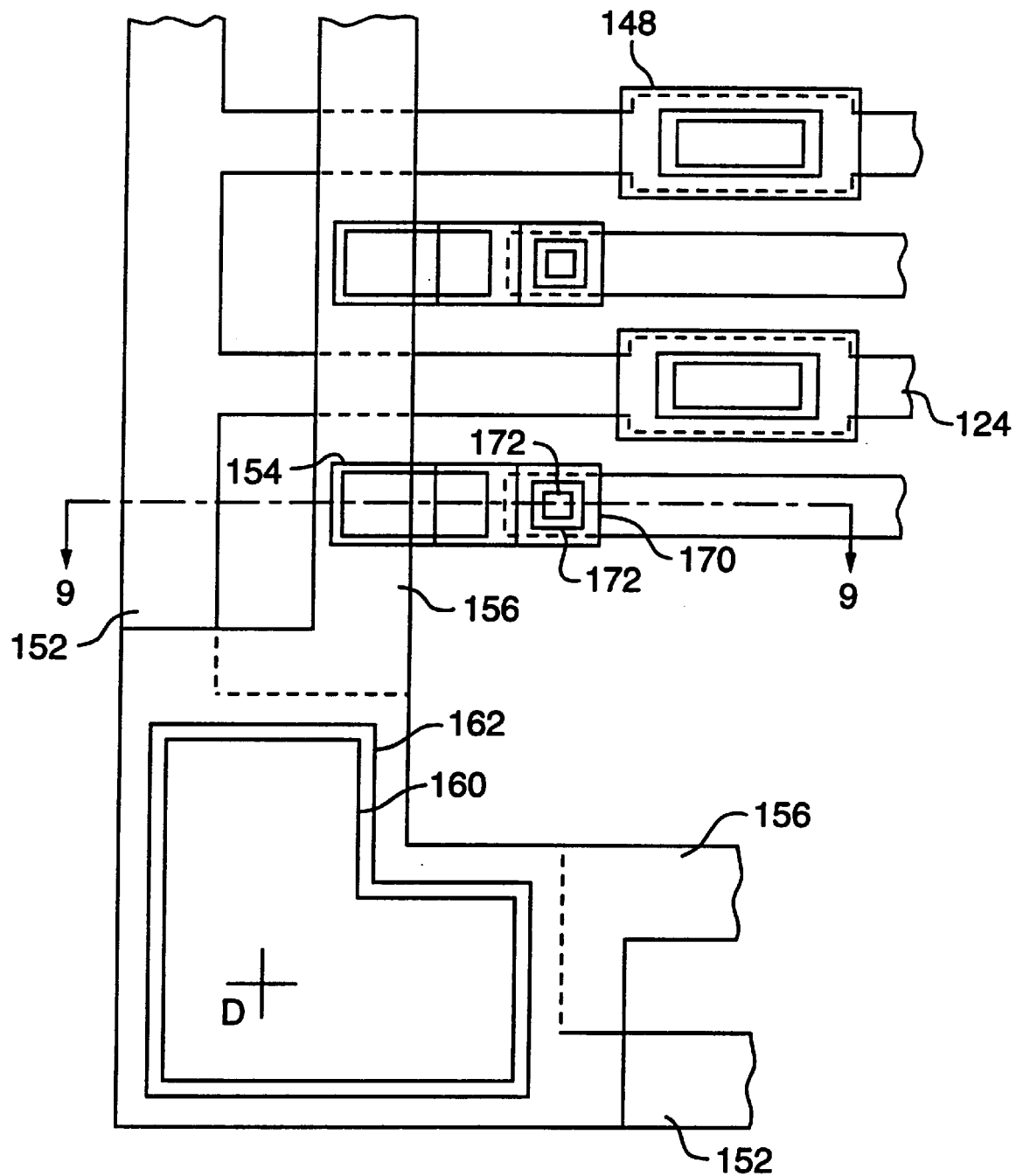
FIG. 7 is a top plan view of a portion of the TFT switch array illustrated in FIG. 6.
Figure 8:
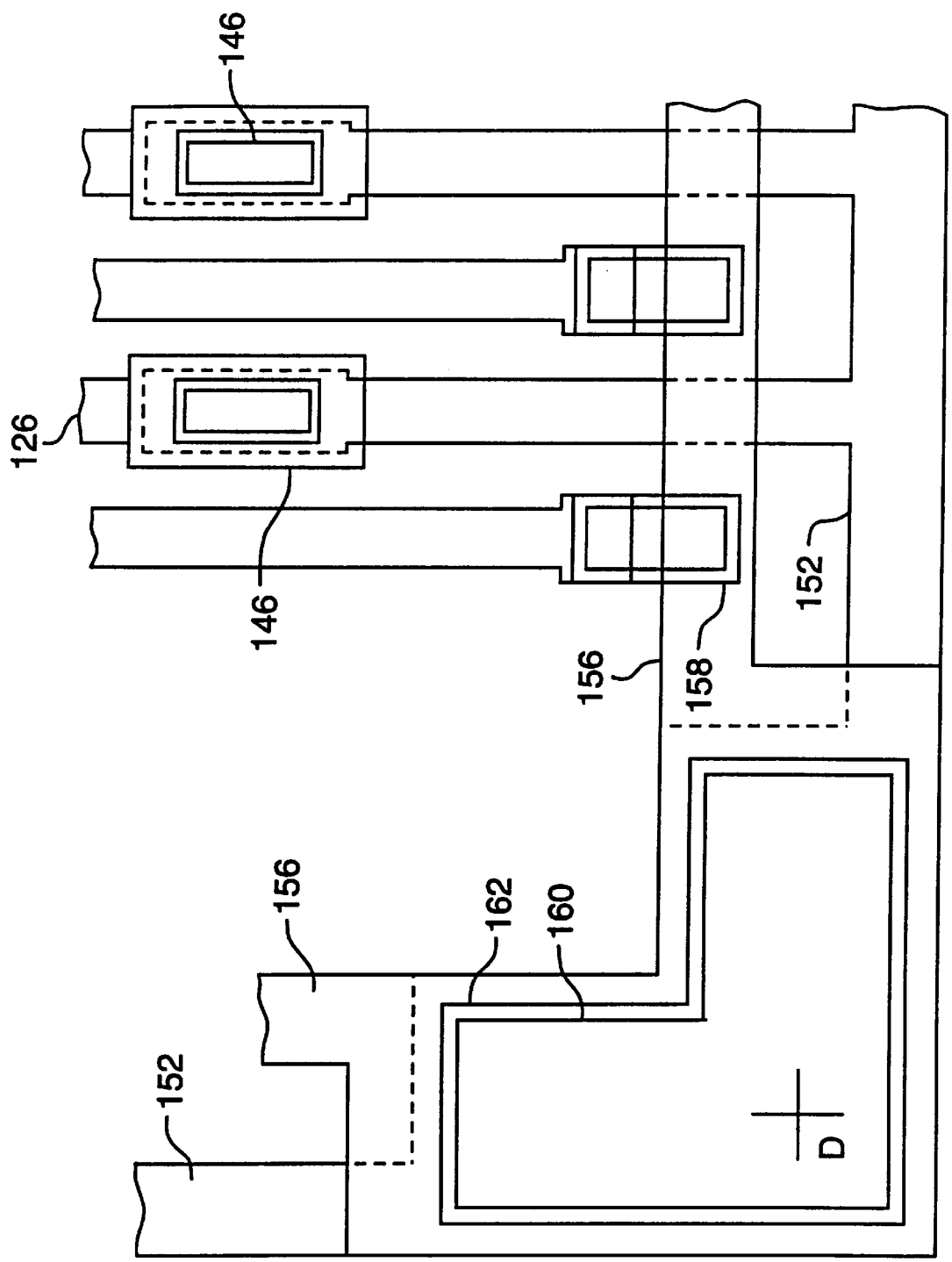
FIG. 8 is a top plan view of another portion of the TFT switch array illustrated in FIG. 6.
Figure 9:
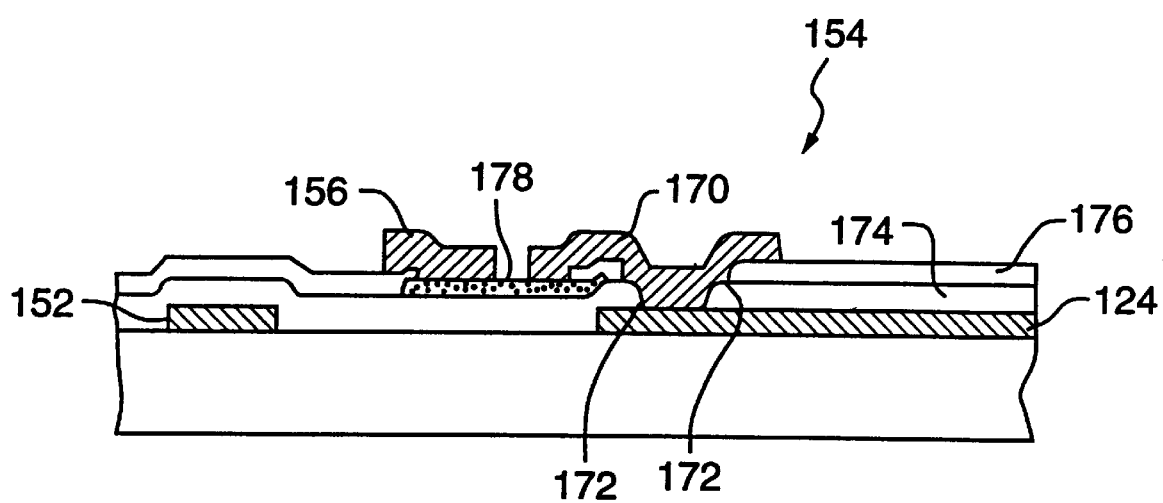
FIG. 9 is a cross-sectional view of FIG. 7 taken along line 9—9.

FIG. 7 best illustrates one of the resistive protection elements 154 although it should be realized that both sets of resistive protection elements 154 and 158 are similar. As can be seen, resistive protection element 154 includes a metal connection tab 170 contacting gate line 124 through vias 172 formed in the gate insulating and passivation layers 174 and 176 of the TFT switch array structure. The tab 170 contacts a CdSe semiconductor material channel 178. The shorting ring 156 also contacts the channel 178 but is spaced from the connection tab 170.

After the TFT switch array 121 and ESD protection circuit 150 have been formed on the glass substrate, the TFT switch array can be cut along scribe lines ABCDA to permit the individual TFT switches in the TFT switch array to be tested. Similar to the previous embodiment, the scribe lines are marked so that after cutting, one end of each of the gate and source lines 124 and 126 remains connected to shorting ring 156 via resistive protection elements 154 and 158 respectively.

Once testing has been completed, the peripheral circuits can be connected to the exposed wire bonding pads 146 and 148 on opposite sides of the TFT switch array 121. After this, the connections between the gate and source lines and the shorting ring 156 can be severed using a programmable laser cutting machine programmed to jump over the gate and source lines 124 and 126 connected to peripheral circuits.

As one of skill in the art will appreciate, the ESD damage protection circuits are present from the first manufacturing stage of the TFT switch array (gate line formation) right through to testing and connection of the TFT switch array to peripheral circuits. Because of this, the likelihood of ESD damage occurring to the TFT switch array is reduced as compared to prior art switch arrays.

Although the ESD damage protection circuits have been described in conjunction with a TFT switch array used in a flat panel detector for radiation imaging, it should be apparent to those of skill in the art that the ESD damage protection circuits can be fabricated during the formation of TFT switch arrays for other applications. Also, the ESD damage protection circuits can be fabricated during the formation of other semiconductor switch arrays where it is desired to protect the switch array from ESD damage during its formation and testing.

Those of skill in the art will also appreciate that variations and modifications may be made to the present invention without departing from the scope thereof as defined by the appended claims.

What is claimed is:

1. A method of inhibiting electrostatic discharge damage to an array of semiconductor switches formed on a common substrate and arranged in rows and columns, individual ones of one of the rows or columns of said array being interconnected by source lines and individual ones of the other of the rows or columns of said array being interconnected by gate lines, said method comprising the steps of:

during formation of said gate lines, connecting one end of each gate line directly to a shorting element and another end of each gate line to a shorting element via a protection element;

during formation of said source lines, connecting one end of each source line directly to a shorting element and connecting another end of each source line to a shorting element via a protection element; and electrically coupling said shorting elements.

2. The method of claim 1 further comprising the steps of connecting said one and another ends of each of said source lines to a first shorting element, connecting said one end of each of said gate lines to a second shorting element and said another end of each of said gate lines to said first shorting element and electrically coupling said first and second shorting elements.

3. The method of claim 2 wherein said protection elements are in the form of resistive protection elements.

4. The method of claim 3 wherein the one ends of each source line extend from one side of said array and said another ends of each source line extend from an opposite side of said array and wherein the one ends of each gate line extend from one side of said array and said another ends of each gate line extend from an opposite side of said array.

5. The method of claim 3 further comprising the step of initially cutting said array along a first set of scribe lines to expose the one ends of said gate and source lines while maintaining the electrical connection between the first and second shorting elements and the another ends of said gate and source lines.

6. The method of claim 5 further comprising the step of further cutting said array along a second set of scribe lines to sever the connection between said another ends of said gate and source lines and said protection elements.

7. The method of claim 6 wherein said further cutting is performed using a laser cutting operation.

8. The method of claim 1 further comprising the step of connecting said one ends of said source and gate lines to a first shorting element, connecting said another ends of said source and gate lines to a second shorting element and electrically coupling said first and second shorting elements.

9. The method of claim 8 wherein said one and another ends of said source and gate lines alternate between opposite sides of said array.

10. The method of claim 9 wherein said protection elements are in the form of resistive protection elements.

11. The method of claim 10 further comprising the step of initially cutting said array along a first set of scribe lines to expose the one ends of said gate and source lines while maintaining the electrical connection between the first and second shorting elements and the another ends of said gate and source lines.

12. The method of claim 11 further comprising the step of further cutting said array along a second set of scribe lines to sever the connection between said another ends of said gate and source lines and said protection elements.

13. The method of claim 12 wherein said further cutting is performed using a laser cutting operation.

14. A semiconductor switch array incorporating electrostatic discharge protection comprising:

an array of semiconductor switches formed on a common substrate and arranged in rows and columns, the individual ones of one of the rows or columns of said array being interconnected by source lines and the individual ones of the other of said rows or columns being interconnected by gate lines; and a pair of electrically coupled shorting elements formed on said substrate, each of said gate and source lines being connected to one of said shorting elements directly and to one of said shorting elements via a protection element.

15. A semiconductor switch array as defined in claim 14 wherein said protection elements are in the form of resistive protection elements.

16. A semiconductor switch array as defined in claim 15 wherein one end of each source line is connected directly to one of said shorting elements and the other end of each source line is connected to said one shorting element via said protection element and wherein one end of each gate line is connected directly to another of said shorting elements and the other end of each gate line is connected to said one shorting element via said protection element.

17. A semiconductor switch array as defined in claim 16 further including scribe lines to guide cutting thereof to expose said one ends of said gate and source lines while maintaining the electrical connection of said other ends of said gate and source lines to said one and another shorting elements.

18. A semiconductor switch array as defined in claim 15 wherein one end of each of said source and gate lines is connected directly to one of said shorting elements and wherein the other end of each of said source and gate lines is connected to another of said shorting elements via a protection element.

19. A semiconductor switch array as defined in claim 18 wherein said one and other ends of said gate and source lines alternate between opposite sides of said array.

20. A semiconductor switch array as defined in claim 19 further including scribe lines to guide cutting thereof to expose said one ends of said gate and source lines while maintaining the electrical connection of said other ends of said gate and source lines to said another shorting element.

* * * * *